United States Patent
Yamada et al.

(10) Patent No.: US 10,318,376 B2
(45) Date of Patent: Jun. 11, 2019

(54) INTEGRATED CIRCUIT AND PROGRAMMABLE DEVICE

(71) Applicant: Hitachi, Ltd., Chiyoda-ku, Tokyo (JP)

(72) Inventors: Hiromichi Yamada, Tokyo (JP);
Tsutomu Yamada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 238 days.

(21) Appl. No.: 15/317,230

(22) PCT Filed: Jun. 18, 2014

(86) PCT No.: PCT/JP2014/066092
§ 371 (c)(1),
(2) Date: Dec. 8, 2016

(87) PCT Pub. No.: WO2015/193984
PCT Pub. Date: Dec. 23, 2015

(65) Prior Publication Data
US 2018/0165153 A1    Jun. 14, 2018

(51) Int. Cl.
*G06F 11/00* (2006.01)
*G06F 11/10* (2006.01)
(Continued)

(52) U.S. Cl.
CPC ...... *G06F 11/1068* (2013.01); *G06F 11/1048* (2013.01); *G06F 11/18* (2013.01);
(Continued)

(58) Field of Classification Search
CPC ...... G06F 11/1068; G06F 11/18; G06F 12/16; G11C 11/4076; G11C 11/409;
(Continued)

(56) References Cited

U.S. PATENT DOCUMENTS 3,665,173 A * 5/1972 Bouricius ............ G05D 1/0077
326/11
3,780,276 A * 12/1973 Carter ................... G06F 11/181
714/797
(Continued)

FOREIGN PATENT DOCUMENTS

| JP | 8-212093 A | 8/1996 |
| JP | 2001-175545 A | 6/2001 |
| JP | 2010-113388 A | 5/2010 |

OTHER PUBLICATIONS

International Search Report (PCT/ISA/210) issued in PCT Application No. PCT/JP2014/066092 dated Aug. 19, 2014 with English translation (Four (4) pages).
Carmichael, C., "Triple Module Redundancy Design Techniques for Virtex FPGAs", Xilinx XAPP197 (v. 1.0.1), Jul. 6, 2006, pp. 1-37 (Thirty-Seven (37) pages).

*Primary Examiner* — Albert Decady
*Assistant Examiner* — Osman M Alshack
(74) *Attorney, Agent, or Firm* — Crowell & Moring LLP

(57) ABSTRACT

Provided is an integrated circuit or the like capable of rapidly correcting erroneous data write and making contents of the RAMs that are in the multiple modular redundancy coincident in a case where a logic circuit performs the erroneous data write to the RAMs while operating logic circuits and RAMs at a high speed. In order to solve the problem, the integrated circuit including logic circuits and RAMs for which data write and data read are performed by the logic circuits includes a multiple modular redundancy logic circuits, a plurality of RAMs respectively connected to the multiple modular redundancy logic circuits, and a RAM access correction unit which compares access signals from the multiple modular redundancy logic circuit to the RAMs to detect an erroneous data write and corrects an error of the RAM.

11 Claims, 12 Drawing Sheets

(51) Int. Cl.
  *G06F 12/16* (2006.01)
  *G06F 11/18* (2006.01)
  *G11C 11/4076* (2006.01)
  *G11C 11/409* (2006.01)
  *G11C 29/52* (2006.01)
  *G11C 29/00* (2006.01)
  *G11C 29/04* (2006.01)

(52) U.S. Cl.
  CPC ............ *G06F 12/16* (2013.01); *G11C 11/409* (2013.01); *G11C 11/4076* (2013.01); *G11C 29/52* (2013.01); *G11C 29/702* (2013.01); *G11C 29/74* (2013.01); *G11C 2029/0409* (2013.01); *G11C 2029/0411* (2013.01)

(58) Field of Classification Search
  CPC ....... G11C 29/52; G11C 29/702; G11C 29/74; G11C 2029/0409; G11C 2029/0411; H03M 13/43; H04L 1/0057
  USPC .......................................... 714/752, 760, 764
  See application file for complete search history.

(56) References Cited

U.S. PATENT DOCUMENTS

| | | | |
|---|---|---|---|
| 9,244,783 B2* | 1/2016 | Wirthlin | G06F 11/1608 |
| 2004/0230935 A1* | 11/2004 | Samudrala | H03K 19/17764 |
| | | | 326/10 |
| 2006/0236168 A1* | 10/2006 | Wolfe | G06F 11/1641 |
| | | | 714/724 |
| 2009/0015322 A1* | 1/2009 | Flautner | H01L 25/0657 |
| | | | 327/565 |
| 2009/0241073 A1* | 9/2009 | Ellavsky | G06F 17/505 |
| | | | 716/132 |
| 2010/0131741 A1 | 5/2010 | Yamada et al. | |
| 2012/0198313 A1* | 8/2012 | Alam | G06F 11/1048 |
| | | | 714/773 |
| 2013/0007679 A1* | 1/2013 | Mendel | H03K 19/17756 |
| | | | 716/106 |
| 2014/0164839 A1* | 6/2014 | Toba | H03K 19/17756 |
| | | | 714/37 |

* cited by examiner

[Fig. 1]
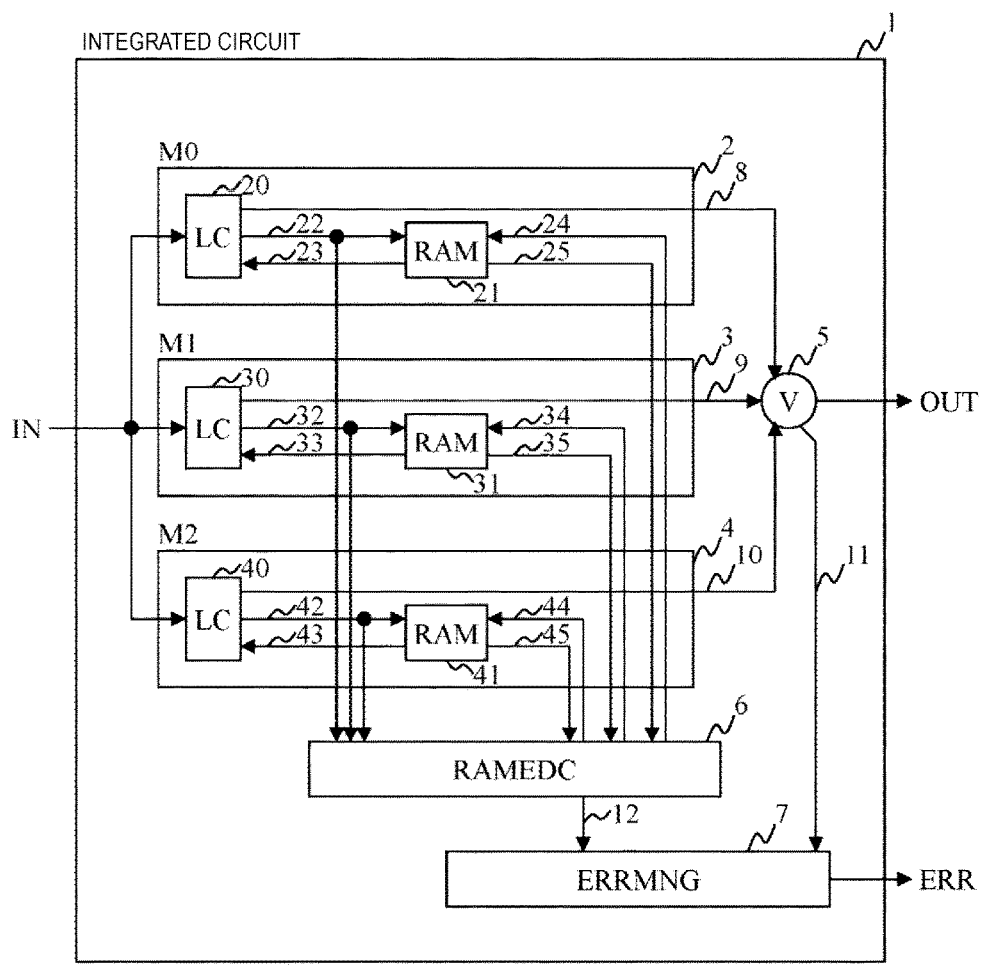
[Fig. 2]
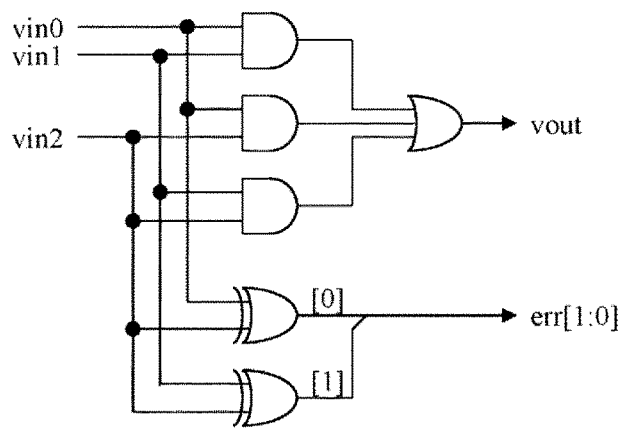

[Fig. 3]
| vin2 | vin1 | vin0 | vout | err[1:0] | | MEANING |
|---|---|---|---|---|---|---|
| 0 | 0 | 0 | 0 | 0 | 0 | NO ERROR |
| 0 | 0 | 1 | 0 | 0 | 1 | vin0 IS ERROR |
| 0 | 1 | 0 | 0 | 1 | 0 | vin1 IS ERROR |
| 0 | 1 | 1 | 1 | 1 | 1 | vin2 IS ERROR |
| 1 | 0 | 0 | 0 | 1 | 1 | vin2 IS ERROR |
| 1 | 0 | 1 | 1 | 1 | 0 | vin1 IS ERROR |
| 1 | 1 | 0 | 1 | 0 | 1 | vin0 IS ERROR |
| 1 | 1 | 1 | 1 | 0 | 0 | NO ERROR |
[Fig. 4]
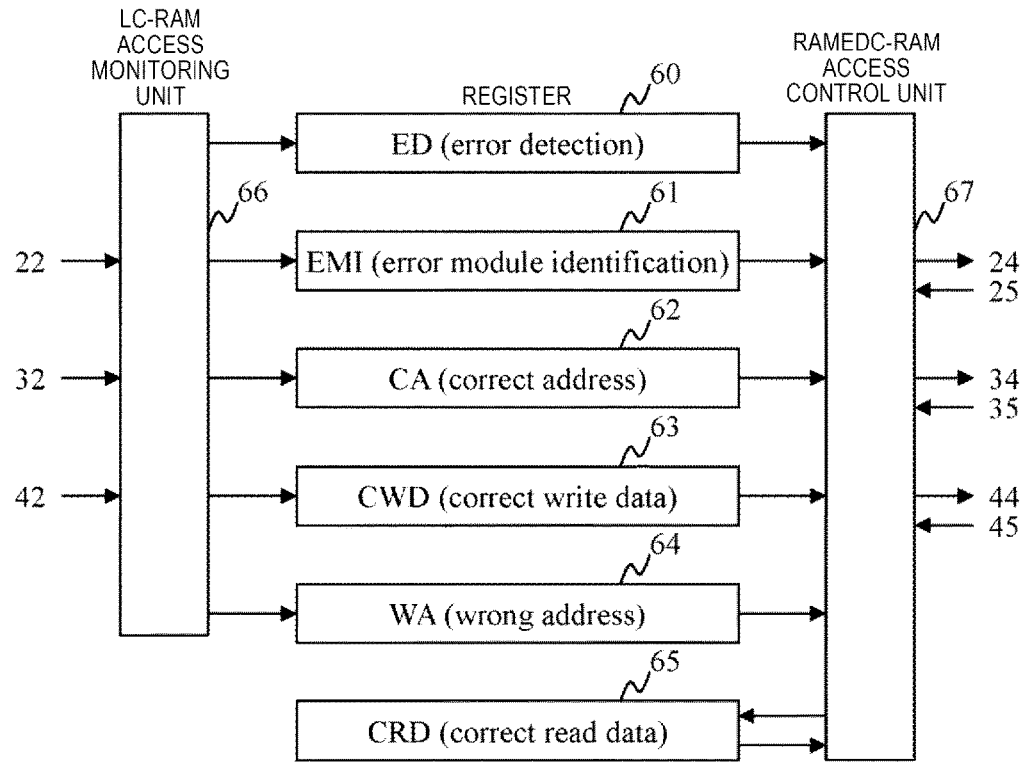

[Fig. 5]

| No. | COMMAND | | ADDRESS | | WRITE DATA | | RAMEDC REGISTER | | | | |
|---|---|---|---|---|---|---|---|---|---|---|---|
| | MAJORITY | MINORITY | MAJORITY | MINORITY | MAJORITY | MINORITY | ED | CA | CWD | WA | CRD |
| 1 | W | N, R | Am | An | WDm | WDn | 1 | Am | WDm | | |
| 2 | W | W | Am = An | | WDm≠WDn | | 1 | Am | WDm | | |
| 3 | N, R | W | Am | An | WDm | WDn | 2 | | | An | RDm |
| 4 | W | W | Am ≠ An | | WDm | WDn | 3 | Am | WDm | An | RDm |
| 5 | MATTERS OTHER THAN THOSE DESCRIBED ABOVE | | | | | | 0 | | | | |

【DESCRIPTION OF REFERENCE SYMBOLS】
COMMAND
　N: NO ACCESS
　R: READ ACCESS
　W: WRITE ACCESS

ADDRESS
　Am: ADDRESS OF RAM ACCESS SIGNAL OF MAJORITY SIDE
　An: ADDRESS OF RAM ACCESS SIGNAL OF MINORITY SIDE

WRITE DATA
　WDm: WRITE DATA OF RAM ACCESS SIGNAL OF MAJORITY SIDE
　WDn: WRITE DATA OF RAM ACCESS SIGNAL OF MINORITY SIDE

RAMEDC REGISTER ED
　0: NO ERROR
　1: NON-EXECUTION OF WRITE (INCLUDING ERRONEOUS WRITE DATA TO CORRECT ADDRESS)
　2: UNAUTHORIZED WRITE
　3: ERRONEOUS ADDRESS

RAMEDC REGISTER CRD
　RDm: MAJORITY SIDE OF READ DATA READ FROM ADDRESS An OF RAM

[Fig. 6]
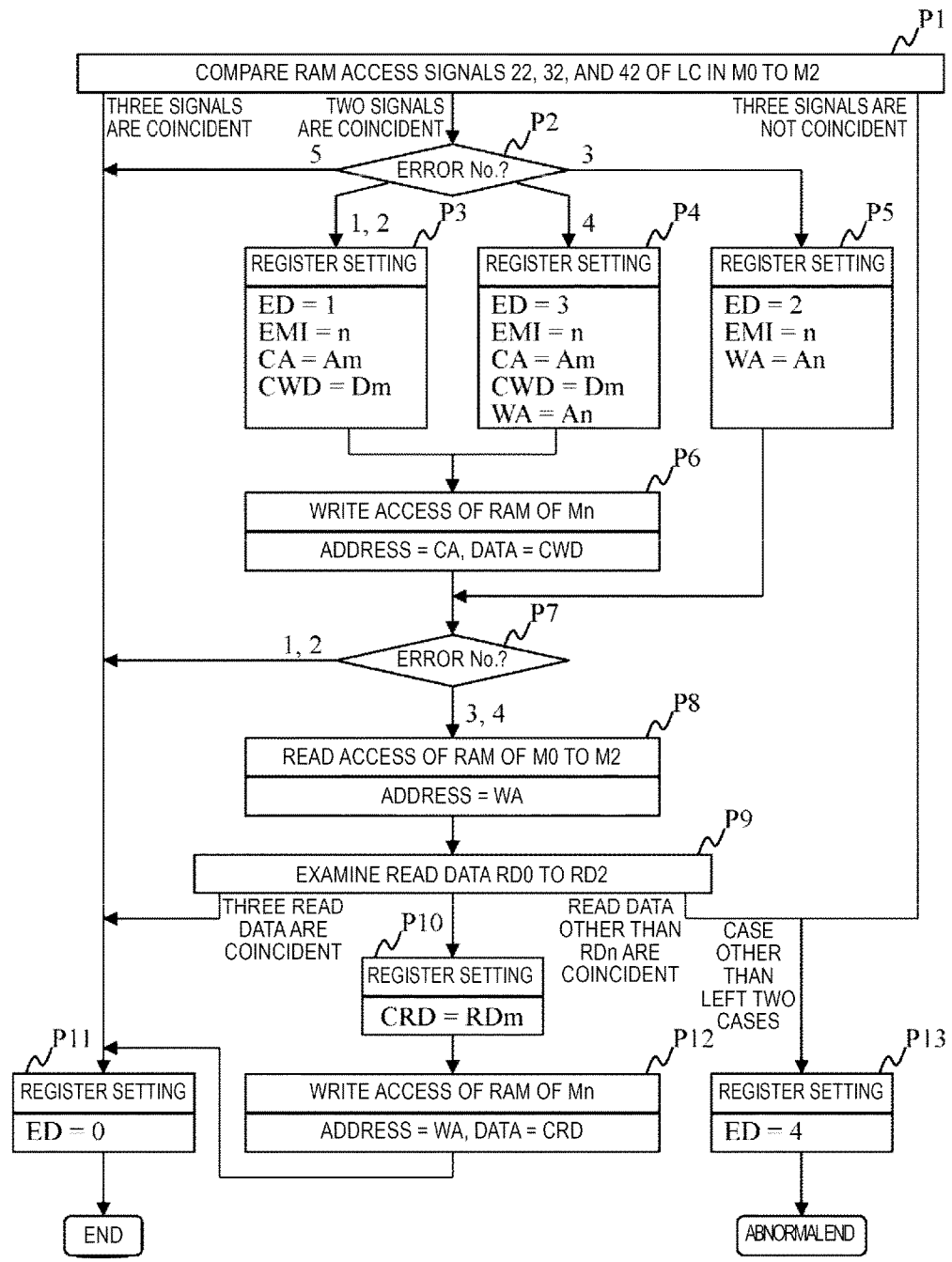

[Fig. 7]
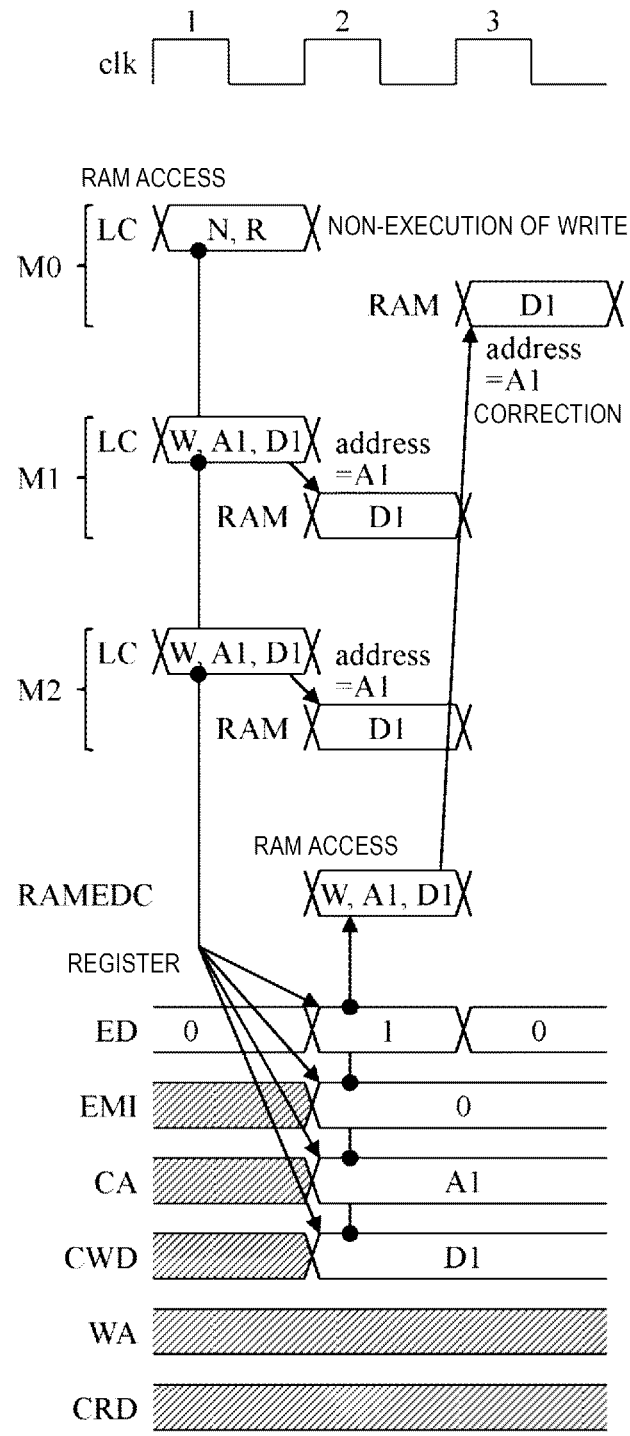

[Fig. 8]
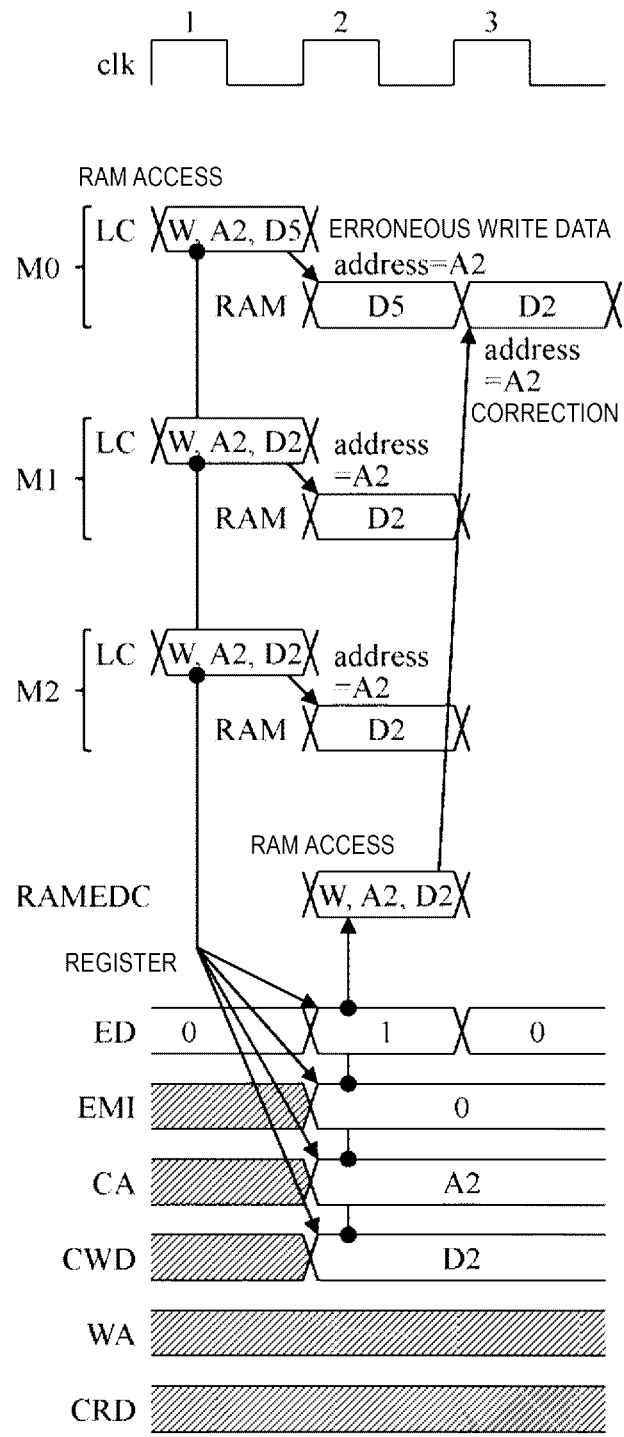

[Fig. 9]
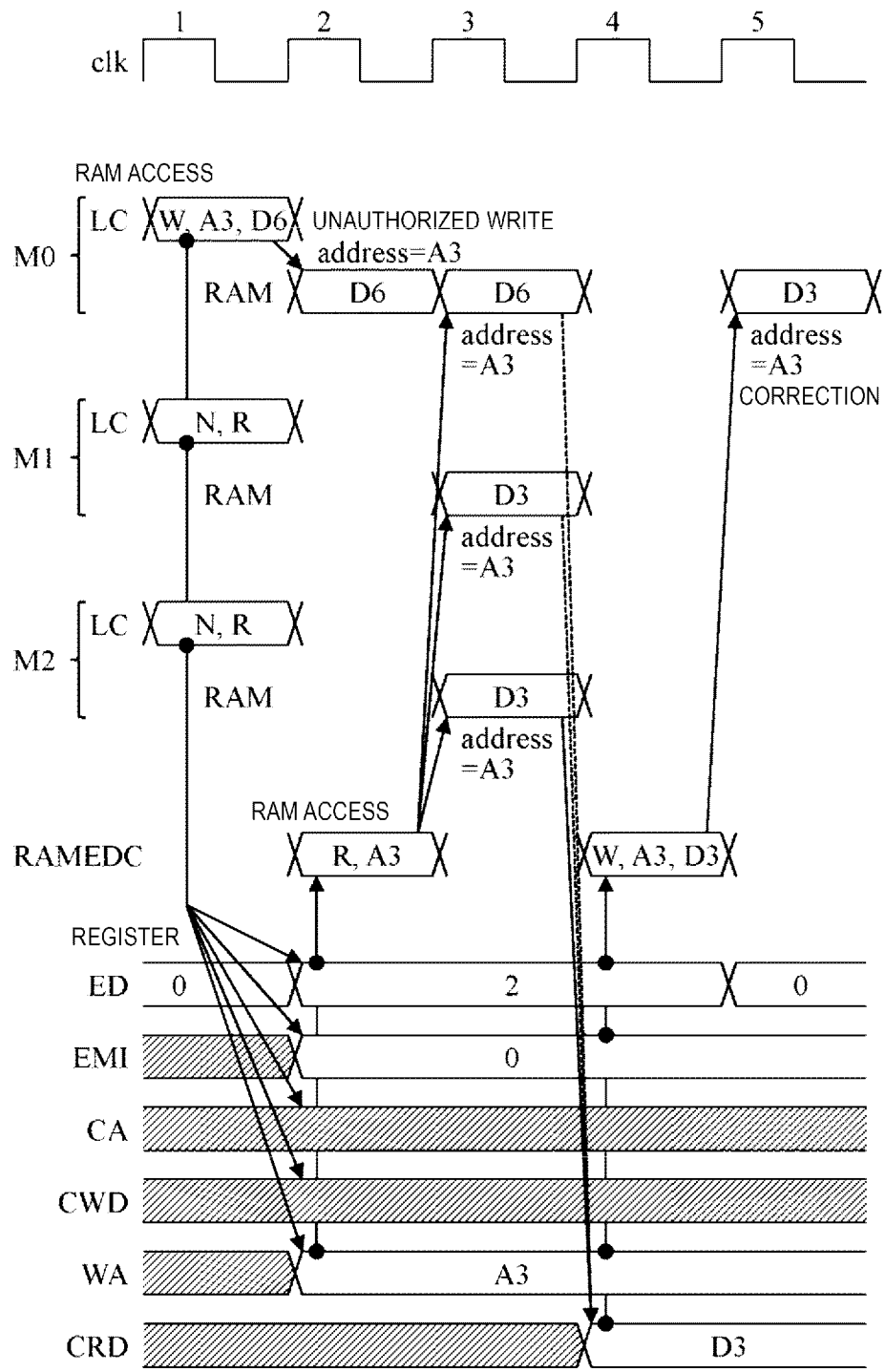

[Fig. 10]
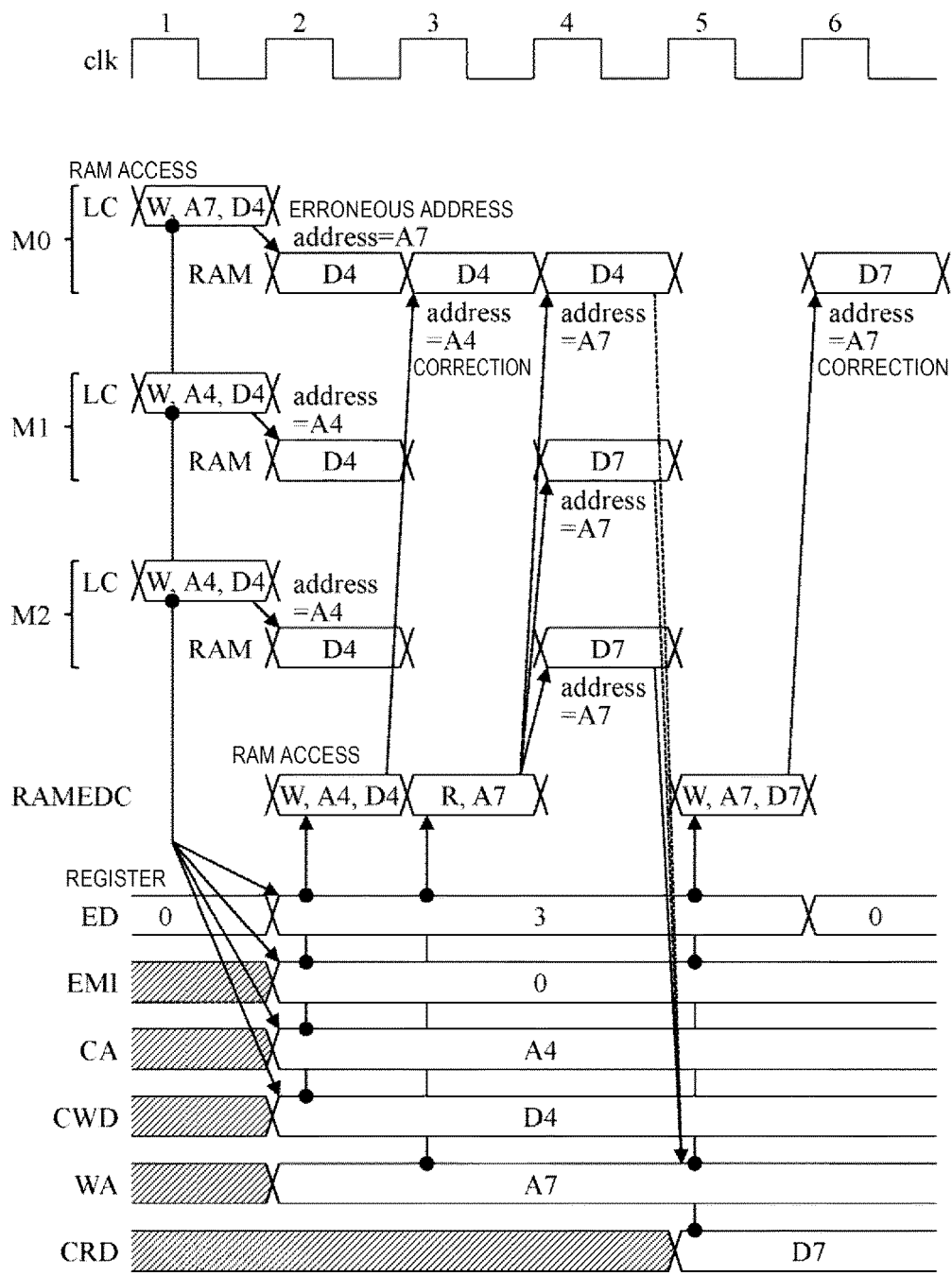

[Fig. 11]
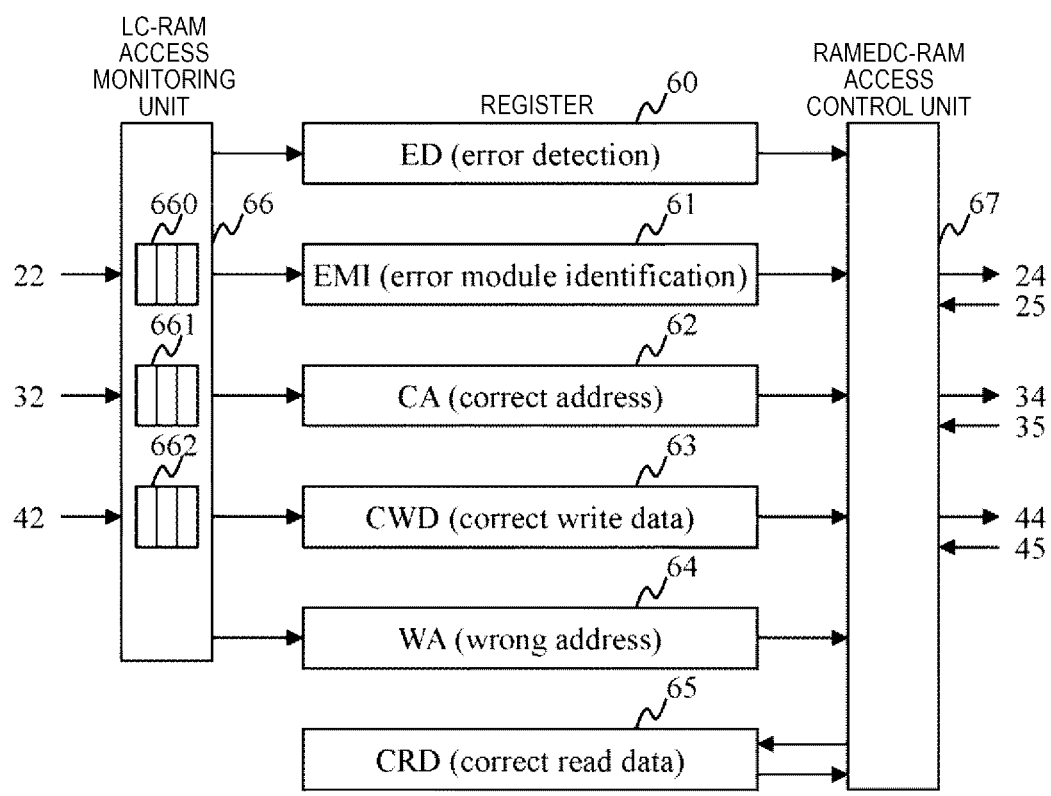

[Fig. 12]
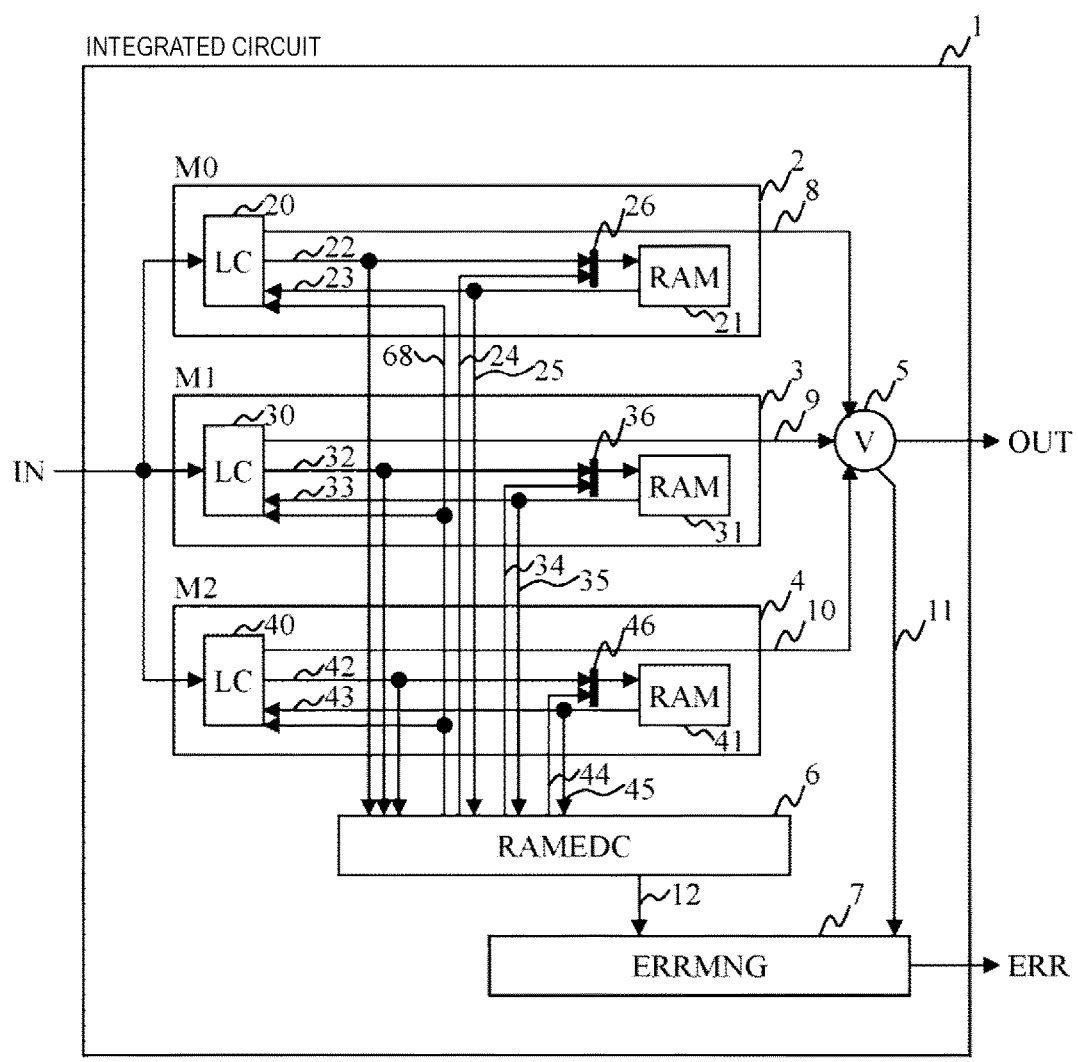

[Fig. 13]
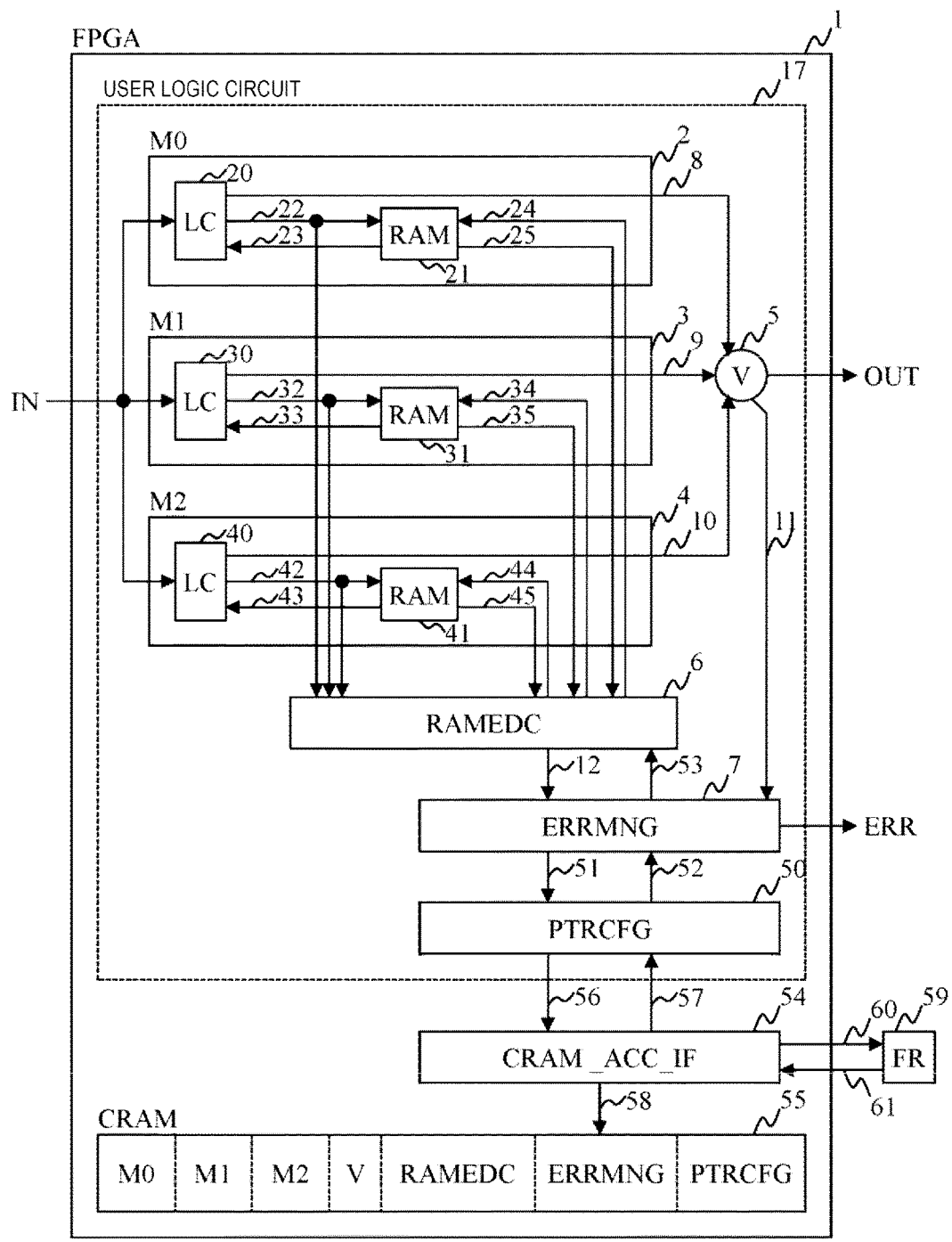

[Fig. 14]
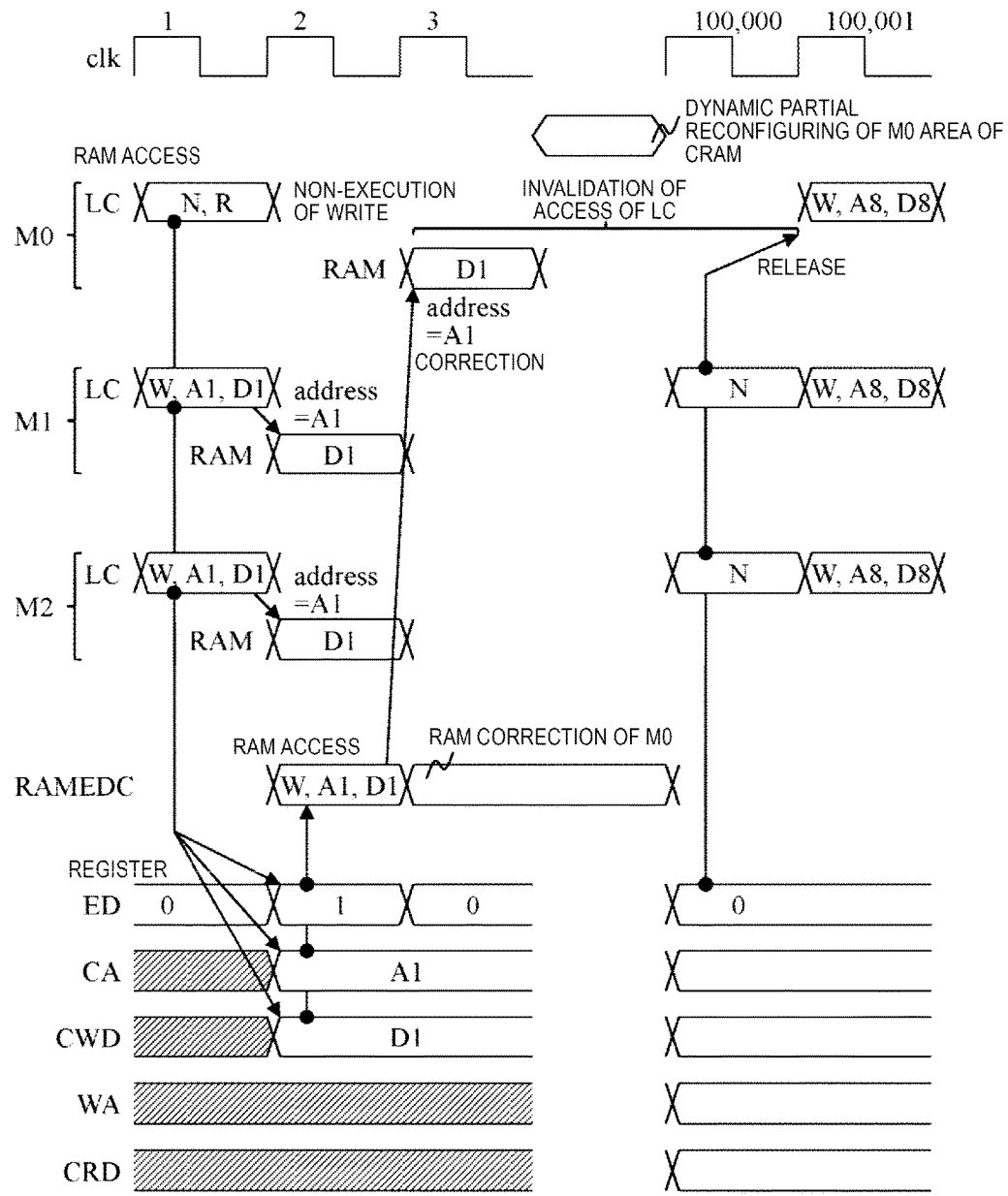

INTEGRATED CIRCUIT AND PROGRAMMABLE DEVICE

TECHNICAL FIELD

The present invention is related to an integrated circuit and a programmable device.

BACKGROUND ART

Although a plurality of special purpose LSIs (ASICs) are used in an apparatus such as a home electric appliance, an AV apparatus, a mobile phone, an automobile, and an industrial machine, the special purpose LSI is an essential component for high performance, advanced function, miniaturization, low power consumption, and cost reduction in an apparatus. In recent years, a reliability problem that a transient failure (soft error) with radiation is likely to occur due to micro-fabrication of a semiconductor process. A static random access memory (SRAM) which is a volatile memory which does not require regular refreshing (storing and maintaining operation) is built-in an LSI such as a microprocessor, a microcontroller, and an AISC as a data storage memory other than a memory chip of a single unit, however, the SRAM is known to have a soft error resistance lower than that of a device such as a combination circuit or a flip flop.

An error detection and correction technique called an error correction code (ECC) is generally used as a countermeasure to the soft error of the SRAM. A redundant code portion is added to the SRAM, a redundant code is generated at the time of data write and stored together with data, the error detection and correction is performed using the data and redundant code at the time of data read. In a scheme called a single error correction and double error detection (SECDED), 1-bit error correction and 2-bit error detection are possible.

When micro-fabrication of semiconductor process is further progressed, it is known that the soft error becomes a problem in a sequential circuit such as a flip flop. Although a situation in which a soft error occurs in a flip flop included in a logic circuit and the logic circuit operates erroneously to cause an erroneous access to the SRAM is considered, in such a case, it is unable to detect and correct an error by the ECC.

Furthermore, contrary to the ASIC in which an internal logic circuit is fixed, a field programmable gate array (FPGA) which is a programmable device in which the internal logic circuit may be defined and changed by a user maintains logic circuit information within a configuration RAM (CRAM) and thus, there is a problem that the soft error occurs in the CRAM, logic circuit information is written and altered, and the logic circuit is changed to malfunction (failed) and erroneously operates.

There is triple modular redundancy as a method not causing an erroneous output even when a logic circuit is failed. The outputs of logic circuits of triple modular redundancy are subjected to majority decision processing and when results of the majority decision processing become a two to one ratio, a majority side that two results coincide with each other is selected. RAM access signals of the logic circuit are subjected to the majority decision processing to thereby make it possible to mask an erroneous access and perform a normal access.

In Non-Patent Literature 1, a method called "TMR block RAM with refresh" is suggested as an error correction method of a block RAM (BRAM) which is a built-in memory of the FPGA. In this method, one port of two access ports of the BRAM is used for accessing a logic circuit and the other port is used for error correction. The BRAM is connected each of the logic circuits of triple modular redundancy and a BRAM refresh circuit is connected to the port for error correction. The BRAM refresh circuit reads data from the same address of three BRAMs simultaneously, performs the majority decision processing on the data, and writes back the data irrelevantly to an access to the logic circuit. Accessing to the BRAM is executed while updating an address periodically.

CITATION LIST

Non-Patent Literature

Non-Patent Literature 1: Carl Carmichael, "Triple Module Redundancy Design Techniques for Virtex FPGAs", XAPP197 (v1.0.1) Jul. 6, 2006

SUMMARY OF INVENTION

Technical Problem

In a method in which RAM access signals of logic circuits of triple modular redundancy are subjected to the majority decision processing, wiring from a logic circuit to a RAM through a majority decision circuit is lengthened to increase an access time and thus, it is inadequate for intending to operate the logic circuit at a high speed. Here, in the BRAM refresh scheme of the Non-Patent Literature 1, the RAM access signal is connected to the BRAM without subjecting the RAM access signals of the logic circuits of triple modular redundancy to the majority decision processing and are able to be operated at a high speed. This method may be used for correction in a case where the soft error occurs in the BRAM and also used for correction in a case where a logic circuit performs erroneous write on the BRAM.

However, the error correction of the BRAM refresh circuit is executed irrelevantly to an access to the logic circuit and thus, a time is required until the error is corrected. For example, in a case where a BRAM of 4 Kbytes is refreshed with an 8-byte data size, when it is assumed that 2 cycles of a read access and a write access are required for a single refresh operation, 4 Kbytes/8 bytes=512 times of refreshing are needed and 1024 cycles are required at minimum. In a case where an operating frequency of the logic circuit is 100 MHz, 10.24 microseconds are required. In the method of related art as described above, in a case where the logic circuit performs an erroneous write on the RAM while operating the logic circuit and the RAM are operated at a high speed, it is difficult to correct the erroneous write in a short time.

Solution to Problem

In order to solve the problem described above, an integrated circuit according to one aspect of the invention includes multiple modular redundancy logic circuits having at least triple modular redundancy, RAMs which are respectively provided in the multiple modular redundancy logic circuits and for which data write and data read are performed by the logic circuits, and a RAM access correction unit that performs an error correction on the RAM which has received an erroneous access signal using write data written in other RAMs when access signals from the logic circuits to the RAMs are compared and the erroneous signal is detected.

Advantageous Effects of Invention

In a case where a logic circuit performs write erroneously to the RAM while allowing the logic circuit and the RAM to be operated at a high speed, it becomes possible to rapidly correct the erroneous write to make contents of the RAMs of multiple modular redundancy coincident with each other.

BRIEF DESCRIPTION OF DRAWINGS

FIG. 1 is a block diagram of an integrated circuit including a RAM access correction circuit of logic circuits of triple modular redundancy in a first embodiment to which the invention is applied.

FIG. 2 is an equivalent logic circuit diagram of a majority decision circuit in Embodiment 1.

FIG. 3 is a truth value table of the majority decision circuit in Embodiment 1.

FIG. 4 is a block diagram of a RAM access correction circuit RAMEDC in Embodiment 1.

FIG. 5 is an error classification table of the RAMEDC in a case where access signals of the logic circuits of triple modular redundancy are divided into a two to one ratio in Embodiment 1.

FIG. 6 is a flowchart of a process performed by the RAMEDC.

FIG. 7 is an error correction processing timing chart of No. 1 in the error classification table of the RAMEDC shown in FIG. 5.

FIG. 8 is an error correction processing timing chart of No. 2 in the error classification table of the RAMEDC shown in FIG. 5.

FIG. 9 is an error correction processing timing chart of No. 3 in the error classification table of the RAMEDC shown in FIG. 5.

FIG. 10 is an error correction processing timing chart of No. 4 in the error classification table of the RAMEDC shown in FIG. 5.

FIG. 11 is a block diagram of a RAM access correction circuit RAMEDC in Embodiment 2.

FIG. 12 is a block diagram of a third embodiment to which the invention is applied.

FIG. 13 is a block diagram of an FPGA including a RAM access correction unit of logic circuits of triple modular redundancy in a fourth embodiment to which the invention is applied.

FIG. 14 is a RAM access error correction processing timing chart in Embodiment 4.

DESCRIPTION OF EMBODIMENTS

Hereinafter, description will be made on embodiments in detail with reference to drawings.

Embodiment 1

FIG. 1 is a block diagram of an integrated circuit including a RAM access correction unit of logic circuits of triple modular redundancy in a first embodiment to which the invention is applied.

An integrated circuit shown in FIG. 1 adopts an LSI where an electronic circuit is fabricated on a thin semiconductor substrate called a wafer, especially, a programmable device of which an internal logic circuit can be defined or changed by a user after manufacture.

The integrated circuit (1) includes modules M0(2), M1(3), and M2(4) of triple modular redundancy, a majority decision circuit V(5), a RAM access correction circuit RAMEDC (6), and an error control circuit ERRMNG (7). An input signal IN of the integrated circuit (1) is input to the M0(2), M1(3), and M2(4), an output signal 8 of the M0(2), an output signal 9 of the M1(3), and an output signal 10 of the M2(4) are subjected to majority decision processing in the majority decision circuit V(5) and a result of the majority decision processing is output as an output signal OUT of the integrated circuit (1). A signal 11 is an error detection signal of the majority decision circuit V(5) and is output in a case where all three inputs are not coincident with each other. The error detection signal 11 is input to the error control circuit ERRMNG (7) and an error signal ERR is notified to the outside of the integrated circuit.

The module M0(2) includes a logic circuit LC (20) and a RAM (21), and a signal 22 is a RAM access signal of the LC (20) and includes a command, an address, and write data. A signal 23 is read data read from the RAM (21) in a case where the RAM access signal (22) of the LC (20) corresponds to a read access. The LC (20) outputs the output signal 8 to the outside of the M0(2).

The module M1(3) includes a logic circuit LC (30) and a RAM (31), and a signal 32 is a RAM access signal of the LC (30) and includes a command, an address, and write data. A signal 33 is read data read from the RAM (31) in a case where the RAM access signal (32) of the LC (30) corresponds to a read access. The LC (30) outputs the output signal 9 to the outside of the M1(3).

The module M2(4) includes a logic circuit LC (40) and a RAM (41), and a signal 42 is a RAM access signal of the LC (40) and includes a command, an address, and write data. A signal 43 is read data read from the RAM (41) in a case where the RAM access signal (42) of the LC (40) corresponds to a read access. The LC (40) outputs the output signal 10 to the outside of the M2(4).

The RAM access correction circuit RAMEDC (6) monitors the RAM access signals 22, 32, and 42 of logic circuits LCs (20, 30, and 40) of triple modular redundancy and immediately corrects an error when the error such as erroneous data write is detected. The RAM access signals 24, 34, and 44 from the RAMEDC (6) to the RAMs (21, 32, and 42) of triple modular redundancy include the command, the address, and the write data. The signals 25, 35, and 45 from the RAMs (21, 31, and 41) of triple modular redundancy to the RAMEDC (6) is read data read in a case where the RAM access signals 24, 34, 44 corresponds to the read access. A signal 12 is an error detection signal of the RAMEDC (6) and is output in a case where all RAM access signals 22, 32, and 42 are not coincident. The error detection signal 12 is input to the error control circuit ERRMNG (7) and the error signal ERR is notified to the outside of the integrated circuit.

FIG. 2 is an equivalent logic circuit diagram of a majority decision circuit in Embodiment 1. The output signals of the logic circuits of triple modular redundancy are respectively input to the vin 0, vin 1, and vin 2. In a case where the output signal is an N-bit signal, N circuits are connected to each bit. The vout is a majority decision output signal and the err[1:0] is an error signal.

FIG. 3 is a truth value table of the majority decision circuit in Embodiment 1. The input signals vin 0, vin 1, and vin 2 take a value of 0 or 1, respectively, and there are eight types of combinations. The majority decision output signal vout outputs a value of a larger number of three inputs. The error signal err[1:0] outputs 00 (no error) in a case where three input signals are coincident and an identification number (01 in a case of vin 0, 10 in a case of vin 1, 11 in a case of vin 2) of input signals that are not coincident in a case where three input signals are divided into a two to one ratio.

FIG. 4 is a block diagram of a RAM access correction circuit RAMEDC (6) in Embodiment 1 and includes six types of registers (60 to 65), an LC-RAM access monitoring unit (66), and a RAMEDC-RAM access control unit (67).

The ED register (60) maintains an error detection result. '0' means no error, '1' means non-execution of write (including erroneous write data to a correct address), '2' means unauthorized write, '3' means erroneous address, and '4' means that all RAM access signals are not coincident. The EMI register (61) is an identification number of an LC which outputs a value with a minority side in a case where the RAM access signals are divided into a two to one ratio and the LC (20) of the M0(2) is '0', the LC (30) of the M1(3) is '1', and the LC (40) of the M2(4) is '2'. The CA register (62) maintains an address of a value with a majority side in a case where the RAM access signals are divided into a two to one ratio. The CWD register (63) maintains write data of the value with a majority side in a case where the RAM access signals are divided into a two to one ratio. The WA register (64) maintains an address of a value with a minority side in a case where the RAM access signals are divided into a two to one ratio. In a case where the value, with a minority side when the RAM access signal is divided into a two to one ratio, generates unauthorized write or erroneous address, the CRD register (65) reads data of an address indicated by the WA register (64) from the RAMs of triple modular redundancy, performs majority decision processing on the read data, and maintains data of the value with a majority side.

The LC-RAM access monitoring unit (66) monitors the RAM access signals 22, 32 and 42 of the logic circuits LCs (20, 30, and 40) of triple modular redundancy, performs error detection, and performs setting of the registers ED (60), EMI (61), CA (62), CWD (63), and WA (64). In a case of '1', '2', '3' when the RAM access signals are divided into a two to one ratio are set in the ED register (60), the RAMEDC-RAM access control unit (67) accesses the RAMs (21, 31, and 41) to correct data erroneously written by the LC.

FIG. 5 is an error classification table of the RAMEDC in a case where access signals of the logic circuits of triple modular redundancy are divided into a two to one ratio in Embodiment 1. Fields of a majority for a command, an address, write data mean majority sides of the RAM access signals and fields of a minority mean minority sides of the RAM access signals.

No. 1 corresponds to a case where the command of the majority side is W (write) and the command of the minority side is N (no access) or R (read). Write data WDm is written into an address Am in the RAM of the majority side, however, writing into the RAM of the minority side is not performed. In this case, the ED register of the RAMEDC is set to 1 (non-execution of write), the CA register is set to Am, and the CWD register is set to WDm.

No. 2 corresponds to a case where the commands of the majority side and the minority side are W and are coincident, the addresses of the majority side and the minority side are coincident, pieces of the write data of the majority side and the minority side are not coincident. Write data WDm is written into the address Am in the RAM of the majority side, however, write data WDn≠WDm is written into the address An=Am in the RAM of the minority side. In this case, the ED register of the RAMEDC is set to 1 (erroneous write data to a correct address), the CA register is set to Am, and the CWD register is set to WDm.

No. 3 corresponds to a case where the command of the majority side is N or R and the command of the minority side is W. Writing into the RAM of the majority side is not performed, however, write data WDn is written into the address An in the RAM of the minority side. In this case, the ED register of the RAMEDC is set to 2 (unauthorized write), the WA register is set to An, and the CRD register is set to data RDm of the majority side obtained by subjecting read data, which is read from the address An of the RAMs of triple modular redundancy, to the majority decision processing.

No. 4 corresponds to a case where the commands of the majority side and the minority side are W and are coincident, and the addresses of the majority side and the minority side are not coincident. Write data WDm is written into the address Am in the RAM of the majority side, however, write data WDn is written into the address An in the RAM of the minority side. In this case, the ED register of the RAMEDC is set to 3 (erroneous address), the CA register is set to Am, the CWD register is set to WDm, and WA register is set to An, and the CRD register is set to data RDm of the majority side obtained by subjecting read data, which is read from the address An of the RAMs of triple modular redundancy, to the majority decision processing.

No. 5 corresponds to a case where under the condition other than No. 1 to No. 4, for example, the commands of the majority side and the minority side are R and are coincident and the addresses of the majority side and the minority side are not coincident. In this case, the erroneous writing into the RAM is not performed and thus, the error correction of the RAM is not needed. For that reason, the ED register is set to 0 (no error).

FIG. 6 is a flowchart of a process performed by the RAMEDC. In P1 (Processing 1), the RAM access signals 22, 32, and 42 of the LC are compared in the modules M0 to M2. In a case where three signals are coincident, the ED register is set to 0 (no error) in P11 and the process is ended.

In a case where two signals are coincident in P1, the process is divided based on the error classification table shown in FIG. 5 in P2. In a case of No. 1 or No. 2, register setting of P3 is performed. The ED register is set to 1 (non-execution of write, erroneous write data to the correct address), the EMI register is set to an identification number n of the LC which outputs the RAM access signal of the minority side, and the CA register is set to the address Am of the RAM access signal of the majority side, and the CWD register is set to the write data WDm of the RAM access signal of the majority side.

In a case where the error classification is No. 3 in P2, register setting of P5 is performed. The ED register is set to 2 (unauthorized write), the EMI register is set to an identification number n of the LC which outputs the RAM access signal of the minority side, and the WA register is set to the address An of the RAM access signal of the minority side.

In a case where the error classification is No. 4 in P2, register setting of P4 is performed. The ED register is set to 3 (erroneous address), the EMI register is set to an identification number n of the LC which outputs the RAM access signal of the minority side, the CA register is set to the address Am of the RAM access signal of the majority side, and the CWD register is set to the write data WDm of the RAM access signal of the majority side, and the WA register is set to the address An of the RAM access signal of the minority side.

The processing of P3 and P4 proceed to P6 and write access is performed on the RAM of the module Mn of which the RAM access signal was the minority side. The address at that time becomes a value of the CA register and the write data becomes a value of the CWD register. The processing of P5 and P6 proceed to P7 and in a case where the error classification is No. 1 or No. 2, the ED register is set to 0 (no error) in P11 and the process is ended. In a case where the error classification is No. 3 or No. 4 in P7, the processing proceeds to P8 and the RAMs of the modules M0 to M2 are subjected to the read access. The address at that time becomes a value of the WA register. The processing of P8 proceeds to processing of P9 and read data RD0 to RD2 are examined. In a case where three pieces of read data coincide with each other, the ED register is set to 0 (no error) in P11 and the process is ended.

In a case where pieces of read data other than read data RDn, which is read from the RAM of the module outputting the RAM access signal of the minority side, are coincident in P9, the process proceeds to processing of P10 and the CRD register is set to the read data RDm of the majority side. The processing of P10 proceeds to processing of P12 and the RAM of Mn is subjected to write access. The address at that time becomes the value of the WA register and the write data becomes the value of the CRD register. The processing of P12 proceeds to processing of P11, the ED register is set to 0 (no error), and the process is ended. In any of a case where three pieces of read data of the read data RD0 to RD2 are coincident and a case where pieces of read data other than read data RDn in P9, the process proceeds to the processing of P13, the ED register is set to 4, and the process is ended as an erroneous end.

FIG. 7 is an error correction processing timing chart for the No. 1 in the error classification table of the RAMEDC shown in FIG. 5. RAM access signals of the LC, addresses and data of RAMs in the modules M0 to M2, the RAM access signals and registers of the RAMEDC are represented. In cycle 1 of a clock signal clk, the RAM access signal of the LC is N or R and writing into RAM is not performed (non-execution of write) in the module M0 and the RAM access signals of the LCs are W and data D1 is written into an address A1 of the RAMs in the modules M1 and M2. In the RAMEDC, the ED register is set to 1 (non-execution of write, erroneous write data to the correct address), the EMI register is set to 0, the CA register is set to A1, and the CWD register is set to D1. In cycle 2 of the clk, the RAMEDC performs write access to the RAM of the M0 and writes data D1 into the address A1 to correct an error caused by non-execution of write. In cycle 3 of the clk, the RAMEDC sets 0 (no error) in the ED register.

FIG. 8 is an error correction processing timing chart of the No. 2 in the error classification table of the RAMEDC shown in FIG. 5. In cycle 1 of the clk, the RAM access signal of the LC is W and data D5 is written into an address A2 of the RAM (erroneous write data) in the module M0 and the RAM access signals of the LCs are W and the data D2 is written into the address A2 of the RAMs in the modules M1 and M2. In the RAMEDC, the ED register is set to 1 (non-execution of write, erroneous write data to the correct address), the EMI register is set to 0, the CA register is set to A2, and the CWD register is set to D2. In cycle 2 of the clk, the RAMEDC performs write access on the RAM of the M0 and writes data D2 into the address A2 to correct an error caused by erroneous write data. In cycle 3 of the clk, the RAMEDC sets 0 (no error) in the ED register.

FIG. 9 is an error correction processing timing chart of the No. 3 in the error classification table of the RAMEDC shown in FIG. 5. In cycle 1 of the clk, the RAM access signals of the LCs are W and data D6 is written into an address A3 of the RAM (unauthorized write) in the module M0 and the RAM access signal of the LC is N or R and writing into the RAMs is not performed in the modules M1 and M2. In the RAMEDC, the ED register is set to 2 (unauthorized write), the EMI register is set to 0, and the WA register is set to A3. In cycle 2 of the clk, the RAMEDC performs read access to the RAMs of the M0 to M2, examines data read from the address A3, and sets D3 read from the RAM of the M1 and the M2 in the CRD register. In cycle 4 of the clk, the RAMEDC performs write access to the RAM of the M0 and writes data D3 into the address D3 to correct an error caused by unauthorized write. In cycle 5 of the clk, the RAMEDC sets 0 (no error) in the ED register.

FIG. 10 is an error correction processing timing chart of the No. 4 in the error classification table of the RAMEDC shown in FIG. 5. In cycle 1 of the clk, the RAM access signals of the LCs are W and data D4 is written into an address A7 of the RAM (erroneous write data) in the module M0 and the RAM access signal of the LC is W and the data D4 is written into the address A4 of the RAMs in the modules M1 and M2. In the RAMEDC, the ED register is set to 3 (erroneous address), the EMI register is set to 0, the CA register is set to A4, the CWD register is set to D4, and the WA register is set to A7. In cycle 2 of the clk, the RAMEDC performs write access to the RAM of the M0 and writes data D4 into the address A4. In cycle 3 of the clk, the RAMEDC performs read access to the RAM of the M0 to M2, examines data read from the address A7, and sets D7 read from the RAMs of the M1 and the M2 in the CRD register. In cycle 5 of the clk, the RAMEDC performs write access to the RAM of the M0 and writes data D7 into the address D7 to correct an error caused by erroneous address. In cycle 6 of the clk, the RAMEDC sets 0 (no error) in the ED register.

Embodiment 2

FIG. 11 is a block diagram of the RAM access correction circuit RAMEDC in Embodiment 2. When comparing with FIG. 4, buffers (660, 661, and 662) with respect to the RAM access signals 22, 32, and 42 are added in the LC-RAM access monitoring unit (66). Each of the buffers can maintain three RAM access signals of three cycles at maximum. In the case of errors of represented in FIG. 7 and FIG. 8, correction write by the RAMEDC is completed in the next cycle and thus, even when clks continue at 2, 3, . . . and write access to the RAM is performed, an error can be corrected with being delayed by 1 cycle. However, in a case of an error represented in FIG. 9, the error is corrected over three cycles from the next cycle and thus, if write access is performed at cycles 2 and 3 of the clk, it is unable to be set in the register. In FIG. 11, the access signals are temporarily maintained in the buffers (660, 661, and 662) of the LC-RAM access monitoring unit (66) and are transferred sequentially to the registers in order of maintaining when correction write by the RAMEDC is completed. By the means described above, it is possible to correct the RAM of the module in which an error occurs without missing the RAM. Similarly, in a case of an error represented in FIG. 10, the error is corrected over four cycles from the next cycle and thus, even when write access is performed at cycles 2 to 4 of the clk, the access signals can be temporarily maintained in the buffers (660, 661, and 662) of the LC-RAM access monitoring unit (66). Thus, when the unauthorized write or the erroneous address occurs in the LC in a module in which an error is generated, three cycles or four cycles are needed for correction of the RAM. In order to set the buffers (660, 661, and 662) in FIG. 11 with the minimum number of 3 stages, the RAM access signal of the LC in a module in which an error is detected may be invalidated.

Embodiment 3

FIG. 12 is a block diagram of a third embodiment to which the invention is applied. When compared with FIG. 1, the RAMs (21, 22, and 23) are formed in a single port RAM and selectors (26, 36, and 46) are added. A wait signal 68 from the RAMEDC (6) to the LCs (20, 30, and 40) in the M0 to M2 is added. In a case where a RAM access by the RAMEDC (6) is present, the selectors (26, 36, and 46) select RAM access signals 24, 34, and 44 of the RAMEDC (6) while in a case where the RAM access by the RAMEDC (6) is not present, the selectors (26, 36, and 46) select RAM access signals 22, 32, and 42 of the LC. In a case where the RAM access by the RAMEDC (6) is present, the RAM access of the LCs (20, 30, and 40) are not able to be executed and thus, the wait signal 68 is output to delay the start of execution of the RAM access of the LCs (20, 30, and 40). When compared with the first embodiment and the second embodiment, in the present embodiment, if a RAM access error occurs, await signal is input to the RAM access of the LC and performance is reduced, however, there is an economic merit that a RAM has just a single port.

Embodiment 4

FIG. 13 is a block diagram of an FPGA including a RAM access correction circuit of logic circuits of triple modular redundancy in a fourth embodiment to which the invention is applied.

An FPGA of the present embodiment is equipped with a dynamic partial reconfiguring function. The dynamic partial reconfiguring function is a function capable of reloading a portion of logic circuit information from an external flash ROM to the CRAM during operation. When the dynamic partial reconfiguring function is used, in a case where the outputs of the logic circuits of triple modular redundancy are divided into a two to one ratio, a logic circuit which outputs a non-coincident output is regarded as being failed and information of the logic circuit present in the CRAM may be reloaded and the failed logic circuit may be repaired.

When the present embodiment is compared with FIG. 1, the integrated circuit (1) of FIG. 1 is replaced with an FPGA (1) and a partial reconfiguring control circuit PTRCFG (50) is added to an area where a circuit, which is called a user logic circuit (17), defined by a user is configured. A CRAM access interface circuit CRAM_ACC_IF (54) and a CRAM (55) are added to the outside the user logic circuit (17) of the FPGA (1) and a flash ROM (FR) (59) and interface signals 60 and 61 of the flash ROM (FR) (59) are added to outside the FPGA (1). Logic circuit information for the FPGA (1) is maintained in the FR (59) and when power is supplied to the FPGA (1), the logic circuit information is loaded onto the CRAM (55) and the FPGA (1) starts operation determined by the logic circuit.

A difference between the first embodiment of FIG. 1 and the present embodiment is that an error detection signal 12 which is output to the error control circuit ERRMNG (7) by the RAM access correction circuit RAMEDC (6) includes an error when the RAM access signals are divided into a two to one ratio and an identification number of a module which generates the error. In this case, the error control circuit ERRMNG (7) requests the partial reconfiguring control circuit PTRCFG (50) to perform partial reconfiguring of the module which generates the error (51). The CRAM (55) divided into areas which store the modules M0, M1, and M2 of triple modular redundancy, the majority decision circuit V, the error control circuit ERRMNG, logic circuit information of the partial reconfiguring control circuit PTRCFG.

The PTRCFG (50) designates an address area of FR (59) in which information of the failed logic circuit and an address area of the CRAM (55) to the CRAM_ACC_IF (54) and requests the CRAM_ACC_IF (54) to reload the information of the failed logic circuit from the FR (59) to the CRAM (55) (56). According to the request 56, the CRAM_ACC_IF (54) outputs the address to the FR (59) (60), reads the logic circuit information (61), and outputs the address and the logic circuit information to the CRAM (55) to perform overwrite (58). When reloading is ended, the CRAM_ACC_IF (54) outputs the end signal 57 to the PTRCFG (50) and the PTRCFG (50) outputs an end signal 52 to the ERRMNG (7). The ERRMNG (7) outputs the end signal 53 to the RAMEDC (6) and notifies the RAMEDC (6) that repairing of a module for which an error is detected is completed. When a write access to a RAM is executed in a normal module, the RAMEDC (6) corrects the RAM of the module, in which the error is generated, with being delayed by 1 cycle and thus, validates the RAM access signal of the module in which the error has generated at the next cycle where the RAM access signal became N (no access) to recover operations in triplicate of the M0 to M2.

FIG. 14 is a RAM access error correction processing timing chart in Embodiment 4. In cycle 1 of a clock signal clk, the RAM access signal of the LC is N or R and writing into the RAM is not performed (non-execution of write) in the module M0 and the RAM access signals of the LCs are W and data D1 is written into the address A1 of the RAMs in the modules M1 and M2. In the RAMEDC, the ED register is set to 1 (non-execution of write, erroneous write data to the correct address), the EMI register is set to 0, the CA register is set to A1, and the CWD register is set to D1. In cycle 2 of the clk, the RAMEDC performs write access to the RAM of the M0 and writes data D1 into the address A1 to correct an error caused by non-execution of write. In cycle 3 of the clk, the RAMEDC sets 0 (no error) in the ED register. Thereafter, the RAM access of the LC in the M0 is invalidated. When the RAMEDC notifies to the ERRMNG that the error of RAM access signals being divided into a two to one ratio is generated in the M0, the partial reconfiguration for the M0 area of the CRAM is executed. During the partial reconfiguration, when a write access to a RAM is executed in a normal module, the correction write is performed to the RAM of the M0 with being delayed by 1 cycle. After the partial reconfiguration of the M0 area of the CRAM is ended, invalidation of the RAM access of the LC is released in the M0 at a timing that the ED register of the RAMEDC is 0 (no error) and the RAM access signals of the M1 and M2 become N (no access) (clk is cycle 10,000). In cycle 10,001 which is the next clk, the contents of the RAMs of the modules M0 to M2 are in a coincidence state and thus, the M0 to M2 are able to start operations in triplicate of the M0 to M2.

The invention is not limited to the embodiments described above and includes various modification examples. For example, the embodiments described above are described in detail in order to make it easy to understand the invention and are not necessarily limited to embodiments provided with all configurations described above. A portion of a configuration of an embodiment is able to be replaced with a configuration of another embodiment and a configuration of another embodiment is able to be added to a configuration of an embodiment. For a portion of a configuration of each embodiment, addition, deletion, or replacement of another configuration is possible.

Control lines and information lines considered necessary for description are illustrated and not all control lines and information lines necessary for a product are illustrated. It may be considered that almost all configurations are actually connected to each other.

REFERENCE SIGNS LIST

1; integrated circuit, FPGA
2, 3, 4; module of triple modular redundancy
5; majority decision circuit
6; RAM access correction circuit
7; error control circuit
8; output signal of LC in M0
9; output signal of LC in M1
10; output signal of LC in M2
11; error detection signal of majority decision circuit (5)
12; error detection signal of RAM access correction circuit
17; user logic circuit inside FPGA
50; partial reconfiguring control circuit
54; CRAM access interface circuit
55; CRAM
59; flash ROM

The invention claimed is:

1. An integrated circuit to rapidly correct erroneous write to make contents of RAMs (random access memories) of multiple modular redundancy coincident with each other, the integrated circuit comprising:
multiple modular redundancy logic circuits having at least triple modular redundancy;
RAMs which are provided in the multiple modular redundancy logic circuits and for which data write and data read are performed by the logic circuit; and
a RAM access correction unit that performs an error correction on the RAM which has received an erroneous access signal using write data written in other RAMs when access signals from the logic circuits to the RAMs are compared and the erroneous signal is detected, wherein
in a case where the access signals from the multiple modular redundancy logic circuit to the RAM are compared and non-coincidence of access signals is detected, the RAM access correction unit regards a value with the largest number of coincidence as a normal signal, regards other values as an abnormal signal, specifies a type of an error of the RAM from the access signal regarded as the normal signal and the access signal regarded as the abnormal signal, and corrects the error,
the RAM access correction unit includes an error detection register that maintains the type of the error of erroneous data write, and
the error detection register represents at least four types of no error, non-execution of write, unauthorized write, and erroneous address.

2. The integrated circuit according to claim 1,
wherein the logic circuits perform access to the RAM according to a predetermined clock, and
in a case where an access signal is detected at a certain clock, the RAM access correction unit performs error correction processing of the RAM at the next clock.

3. The integrated circuit according to claim 1,
wherein the RAM access correction unit includes a normal address register maintaining an address value of an access signal with the largest number of coincidence and a normal write data register which sets a value of write data of the access signal with the largest number of coincidence in a case where the erroneous data write is detected.

4. The integrated circuit according to claim 1,
wherein in a case where the access signals from the multiple modular redundancy logic circuit to the RAM are compared and non-coincidence of access signals is detected, when a command of the access signal regarded as normal is write and a command of the access signal regarded as abnormal is not write, the RAM access correction unit performs write access to a RAM to which an access regarded as abnormal is executed using the address and write data of the access signal regarded as normal, thereby correcting an error.

5. The integrated circuit according to claim 1,
wherein in a case where the access signals from the multiple modular redundancy logic circuit to the RAM are compared and non-coincidence of access signals is detected, when a command of the access signal regarded as normal and a command of the access signal regarded as abnormal coincide with each other in terms of write, the addresses coincide with each other, and write data do not coincide with each other, the RAM access correction unit performs write access to a RAM to which an RAM access regarded as abnormal is executed using the address and write data of a RAM access signal regarded as normal, thereby correcting an error.

6. The integrated circuit according to claim 1,
wherein in a case where the access signals from the multiple modular redundancy logic circuit to the RAM are compared and non-coincidence of access signals is detected, when a command of the access signal regarded as normal is not write and a command of the access signal regarded as abnormal is write, the RAM access correction unit reads data from the RAMs connected to the multiple modular redundancy logic circuits using the address of the access signal regarded as abnormal and performs write access to the RAM to which the RAM access regarded as abnormal is executed using the data with the largest number of coincidence as normal data, thereby correcting an error.

7. The integrated circuit according to claim 1,
wherein in a case where the access signals from the multiple modular redundancy logic circuits to the RAMs are compared and non-coincidence of access signals is detected, when a command of the access signal regarded as normal and a command of the access signal regarded as abnormal coincide with each other in terms of write and the addresses of the access signals do not coincide with each other, the RAM access correction unit performs write access to a RAM to which an RAM access regarded as abnormal is executed using the address and the write data of a RAM access signal regarded as normal, reads data from the RAMs connected to the multiple modular redundancy logic circuits using the address of the access signal regarded as abnormal, and performs write access to the RAM to which the RAM access regarded as abnormal is executed using the data with the largest number of coincidence as normal data, thereby correcting an error.

8. The integrated circuit according to claim 1,
wherein the RAM access correction unit includes a buffer of three stages or more which temporarily stores the access signals from the multiple modular redundancy logics circuit to the RAMs, temporarily stores an access signal during correction of the error of the RAM to which a RAM access regarded as abnormal is executed, and performs a comparison after correction of the error of the RAM to which the RAM access regarded as abnormal is executed is ended.

9. The integrated circuit according to claim 1,
wherein in a case where the RAM access correction unit detects erroneous data write, an RAM access of a logic circuit generating an error is invalidated until error correction of the erroneous data write is ended.

10. An integrated circuit to rapidly correct erroneous write to make contents of RAMs (random access memories) of multiple modular redundancy coincident with each other, the integrated circuit comprising:
    multiple modular redundancy logic circuits having at least triple modular redundancy;
    RAMs which are provided in the multiple modular redundancy logic circuits and for which data write and data read are performed by the logic circuit; and
    a RAM access correction unit that performs an error correction on the RAM which has received an erroneous access signal using write data written in other RAMs when access signals from the logic circuits to the RAMs are compared and the erroneous signal is detected,
    wherein the RAM access correction unit includes an abnormal address register which sets an address value of an access signal other than the access signal with the largest number of coincidence and a normal read data register which reads data from the address set in the abnormal address register of the RAMs connected to the multiple modular redundancy logic circuits and regards a value with the largest number of coincidence as normal data in a case where the erroneous data write is detected.

11. A programmable device that loads logic circuit information maintained in a computer-readable storage medium onto an internal configuration RAM when power is supplied, configures a logic circuit, and is operated to rapidly correct erroneous write to make contents of RAMs (random access memories) of multiple modular redundancy coincident with each other, the programmable device comprising:
    a dynamic partial reconfiguring unit which reloads a portion of a logic circuit from the computer-readable storage medium during operation;
    multiple modular redundancy logic circuits having at least triple modular redundancy;
    a plurality of RAMs respectively connected to the multiple modular redundancy logic circuits; and
    a RAM access correction unit which compares access signals from the multiple modular redundancy logic circuits to the RAMs to detect an erroneous access signal and corrects an error of the RAMs,
    wherein
    in a case where the access signals from the multiple modular redundancy logic circuit to the RAM are compared and non-coincidence of access signals is detected, the RAM access correction unit regards a value with the largest number of coincidence as a normal signal, regards other values as an abnormal signal, specifies a type of an error of the RAM from the access signal regarded as the normal signal and the access signal regarded as the abnormal signal, and corrects the error,
    the RAM access correction unit includes an error detection register that maintains the type of the error of erroneous data write, and
    the error detection register represents at least four types of no error, non-execution of write, unauthorized write, and erroneous address.

* * * * *